(12) United States Patent
Gustavson et al.

(10) Patent No.: US 7,515,620 B2
(45) Date of Patent: Apr. 7, 2009

(54) METHOD FOR OPTIMIZING LASER DIODE OPERATING CURRENT

(75) Inventors: Todd L. Gustavson, Sunnyvale, CA (US); Andreas G. Weber, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 1335 days.

(21) Appl. No.: 10/426,472

(22) Filed: Apr. 29, 2003

(65) Prior Publication Data

US 2007/0253454 A1   Nov. 1, 2007

Related U.S. Application Data

(60) Provisional application No. 60/422,315, filed on Oct. 29, 2002.

(51) Int. Cl.
*H01S 3/00*   (2006.01)
(52) U.S. Cl. .................. 372/38.07; 372/38.1; 372/38.02
(58) Field of Classification Search .............. 372/38.02, 372/38.1, 38.07
See application file for complete search history.

(56) References Cited

U.S. PATENT DOCUMENTS 6,853,657 B2 *  2/2005  Althaus et al. ........... 372/38.02
6,917,639 B2 *  7/2005  Ishida et al. ............. 372/38.02
6,947,455 B2 *  9/2005  Chieng et al. .......... 372/29.021
2002/0172240 A1 * 11/2002  Kwark ......................... 372/26
2004/0246460 A1 * 12/2004  Auracher et al. ........... 356/4.01

OTHER PUBLICATIONS

Article entitled "Small-Signal Frequency Response of Long-Wavelength Vertical-Cavity Lasers", dated Oct. 2001, IEEE Photonics Technology Letters, vol. 13, No. 10, by K.A. Black, E.S. Bjorlin; J. Piprek, E.L. Hu, and J.E. Bowers.

* cited by examiner

*Primary Examiner*—Minsun Harvey
*Assistant Examiner*—Phillip Nguyen
(74) *Attorney, Agent, or Firm*—Workman Nydegger

(57) ABSTRACT

A method for optimizing a dc operating drive current of a laser diode is presented. Lasers of a particular type are characterized in terms of the dependency of certain parameters on temperature and of the minimum bias current required for adequate laser speed. The minimum bias current is determined using the operating bias current minus the threshold current all normalized by the threshold current. For individual laser diodes, the threshold current and slope efficiency are obtained at various temperatures to allow calculation at operating temperatures of interest. The minimum laser bias current for speed can then be determined over the operating temperature range. This may be done by setting the optical power to the highest value calculated using this minimum acceptable bias criterion over the operating temperature range. The ac and dc laser driver current sourcing requirements may be computed to ensure laser and module compatibility.

16 Claims, 2 Drawing Sheets

METHOD FOR OPTIMIZING LASER DIODE OPERATING CURRENT

RELATED APPLICATION

This application claims the benefit, under 35 USC § 119(e), of U.S. Provisional Application No. 60/422,315 filed on Oct. 29, 2002, which is incorporated by reference herein in its entirety.

BACKGROUND OF THE INVENTION

The present invention is directed to an optical transceiver module.

Optical transmitters are a well-known and essential optical component used in data storage and telecommunications networking applications. Typically, the components required to convert electrical to optical signals are referred to as Transmitter Optical Sub-Assemblies (TOSAs). The optical output of a TOSA is typically focused into an optical fiber. Once the optical signals reach their destination, they are typically focused into Receiver Optical Sub-Assemblies (ROSAs) for conversion back into corresponding electrical signals.

A TOSA typically includes a laser diode for producing an optical signal and a lens for focusing the optical signal into the input end of an optical fiber. Laser diodes (e.g. distributed feed-back laser diodes) are typically sensitive to back-reflected light (e.g. light reflected off of the input face of the optical fiber back into the laser diode). Therefore, TOSAs also typically include an optical isolator that passes the output optical signal from the laser diode to the optical fiber, but prevents any back-reflected light from reaching the laser diode.

Transceiver modules for fiber-based communications applications typically contain one or more TOSAs and ROSAs along with associated drive electronics, and each of these components must conform to a variety of performance criteria specified over a wide operating temperature range. These performance criteria include average power output, extinction ratio, eye diagram mask margin, and speed/bit rate. Various schemes may be employed at the module level to adjust the ac swing and the dc current bias to the laser diode to compensate for temperature sensitivity of certain laser diode parameters, hence maintaining the module specifications over the operating temperature range. To improve laser speed characteristics, the diode laser is usually biased at an average dc bias current above the lasing threshold current. FIG. 1 shows a sketch of an exemplary P v. I curve indicating the threshold current ($I_{th}$) and a dc bias current ($I_{op}$). An ac modulation is applied to generate the low power 0 bits (shown as P=0 in FIG. 1) and high power 1 bits (shown as P=1 in FIG. 1). Other schemes such as a return to zero bit encoding scheme for which bits are sent as pulses of light may be used instead for other applications, for example, when dispersion is critical. The dc current is often controlled using a constant power feedback loop, stabilizing the current detected in the monitor photodiode within the laser diode package.

The ability of the laser diode to perform at the required speed depends on the dc current bias (dc drive current), where generally the speed performance increases as the de drive current is increased. Traditional methods used for selecting the operating dc drive current of the laser diode include: a) adjusting the dc drive current until the output power reaches a desired value, and b) adjusting the dc drive current to a fixed offset above the laser diode's threshold current $I_{th}$. Unfortunately, neither of these procedures guarantees that the dc drive current is sufficient to achieve the required speed performance at each temperature throughout the operating range.

In addition to the minimum speed requirement, a laser has to satisfy a boundary imposed by the laser diode's natural relaxation oscillation resonance frequency. A laser diode has a relaxation oscillation resonance frequency $f_0$ at which it is naturally inclined to resonate, limiting its useful bandwidth. If this resonance frequency occurs within the bandwidth required by the data rate, the resonance will be excited upon data transmission. The resonance frequency, if excited, may cause overshoot and ringing on the signal, possibly eye diagram mask hits indicative of bit errors and hence module failures. Therefore, the relaxation resonance frequency $f_0$ serves as an upper boundary on the maximum usable bandwidth of the laser, limiting the bit rate at which the laser can operate. The square of the relaxation resonance frequency $f_0$ is proportional to the dc drive current less the threshold current, and inversely proportional to the active volume of the device. See, for example, *Small-Signal Frequency Response of Long-Wavelength Vertical-Cavity Lasers*, IEEE Photonics Technology Letters, Vol. 13, No. 10, October 2001. By merely selecting the dc drive current based solely on a desired power level or on a fixed offset above the threshold current, there is no guarantee that the relaxation resonance frequency will not fall within the operating bandwidth of the laser diode. Thus, unless the resonance frequency is taken into account, the laser diode may fail to meet its speed performance requirement over the entire range of operating temperatures. Although the laser speed increases with dc bias current, the bias current can not be increased without bound because a) laser diode lifetime decreases with increased bias current, b) laser drive circuitry has limited available output current, c) increasing the dc bias also increases the ac swing needed to maintain the specified extinction ratio ER [dB] that is defined in terms of the ratio of the module optical power levels for the one and zero bits (ER=10 log ($P_1/P_0$)), d) electromagnetic interference (EMI) increases proportionally to the ac swing, and e) the specified output power may be exceeded, requiring attenuation.

There is a need for a method of optimizing the operational dc drive current of a laser diode that not only produces the desired power but also the desired speed performance throughout the expected operating temperature range, without the time and expense of checking speed performance over temperature for each optimized laser diode.

SUMMARY OF THE INVENTION

The present invention solves the aforementioned problems by providing a method that optimizes the laser diode dc drive current to ensure that the laser will meet power and speed performance requirements over the full operating temperature range. The method of the present invention includes characterizing certain performance parameters of the particular laser diode type to be used. Using these performance parameters, a characteristic minimum bias current that will guarantee sufficient speed of operation is established. These performance parameters for determining the characteristic minimum bias current apply to a particular laser type, or a group of lasers.

The method includes determining general characteristics for a group of laser diodes. The general characteristics include a functional dependence of certain parameters (e.g., $I_{th}$ and SE) on temperature, usually in the form of an equation that includes one or more coefficients. A minimum $I_{op}$ that produces the required speed is experimentally determined, and a minimum k, wherein $k(T)=(I_{op}-I_{th})/I_{th}$, is determined based on the minimum $I_{op}$.

The method also includes determining characteristics for individual laser diodes in the group. To determine some of the coefficient(s) in the functional dependence equation, $I_{th}$ and SE are determined at multiple temperatures for individual laser diodes that will be used in a TOSA. Enough data points should be taken to determine the unknown coefficients of the temperature dependence equation. Using the data, it is possible to calculate for any temperature how the laser diode will behave in terms of k, ac drive requirement, dc drive current requirement, and optical power.

After verifying that the calculated laser driver current requirements, minimum k value, and desired power target can all be satisfied, the laser can be built into a TOSA. Optical attenuation may be implemented as needed to meet optical power targets for the TOSA and module while maintaining the dc bias current $I_{op}$ as calculated above.

Other objects and features of the present invention will become apparent by a review of the specification, claims, and appended figures.

DETAILED DESCRIPTION OF THE PREFERRED EMBODIMENTS

The present invention is a method for optimizing the dc drive current of a laser diode to produce the desired power and speed performance throughout a range of operating temperatures. Currently, optimization of dc drive current is complicated by the fact that each laser has different characteristics from others due to differences in manufacturer, epitaxial design, or wafer/lot. The invention simplifies the optimization process by conducting the optimization process for a group of lasers, wherein each group is reasonably expected to exhibit unique behavior. The specific criteria for this categorization depend on the degree and type of variation that is considered acceptable for a particular application. Once the lasers are categorized, certain properties of a statistical sample of lasers from each group is measured. In addition, certain measurements must be made for each of the particular laser diodes in the statistical sample group. The measurement data is then used to determine the optimal dc drive current that will produce the desired power and speed performance over an entire operating temperature range while ensuring that the limits of the laser driver circuitry output current requirements are not exceeded.

The method is applicable to many types of laser diodes. For simplicity of illustration, the invention is described herein as being applied to laser diodes that generate laser beams of a wavelength around 1310 and around 1550 nm, of either Fabry-Perot or distributed feedback (DFB) type construction. These laser diodes are generally referred to as "longwave" lasers, as opposed to lasers that generate light of wavelength 850 nm or less. For longwave lasers, as temperature increases, $I_{th}$ increases exponentially, SE decreases exponentially, and k decreases. In general, the mathematical form of these temperature dependencies are known or determined for a particular laser type. The number of unknown coefficients in the formula will determine the number of temperature data points needed to characterize a particular laser diode. For longwave lasers, the highest drive currents and optical power required to satisfy the k requirement for minimum speed occurs at the highest operating temperature.

Figure 1:
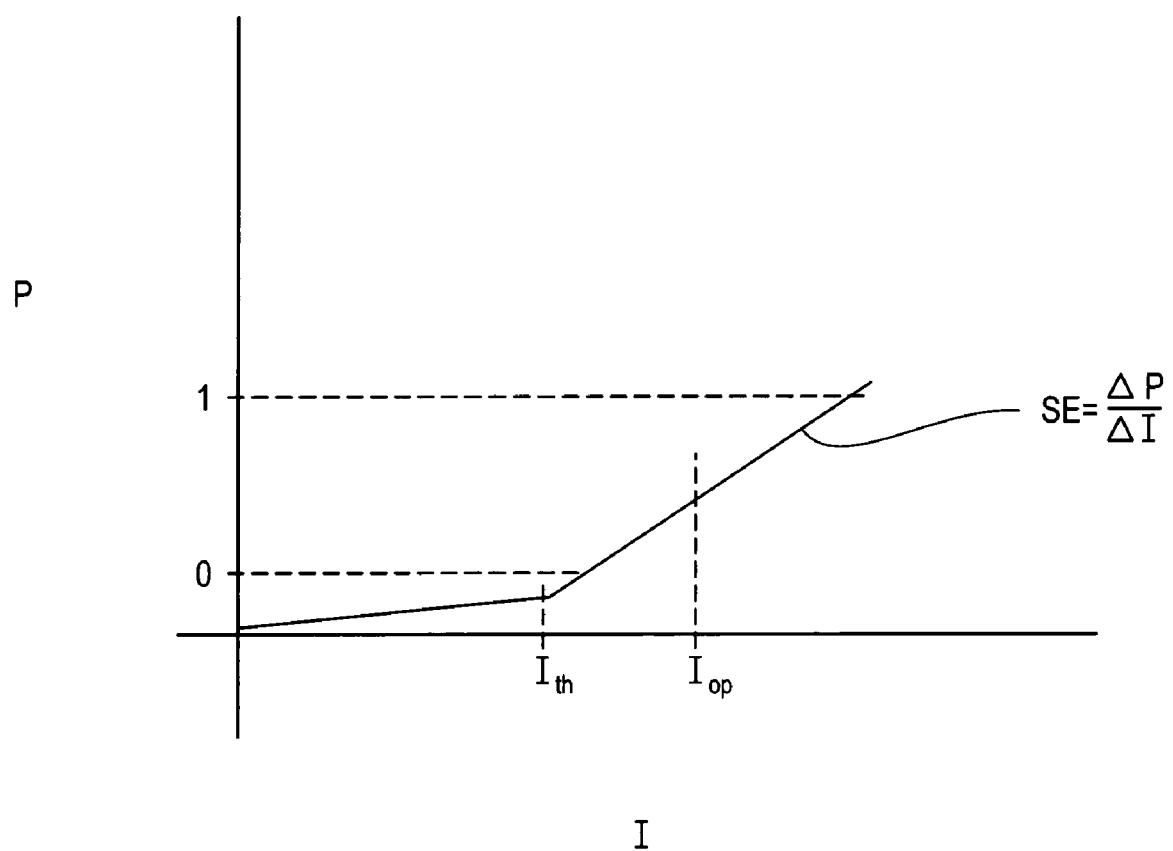
FIG. 1 is an graph of power level as a function of operating current in an exemplary laser diode.
Figure 2:
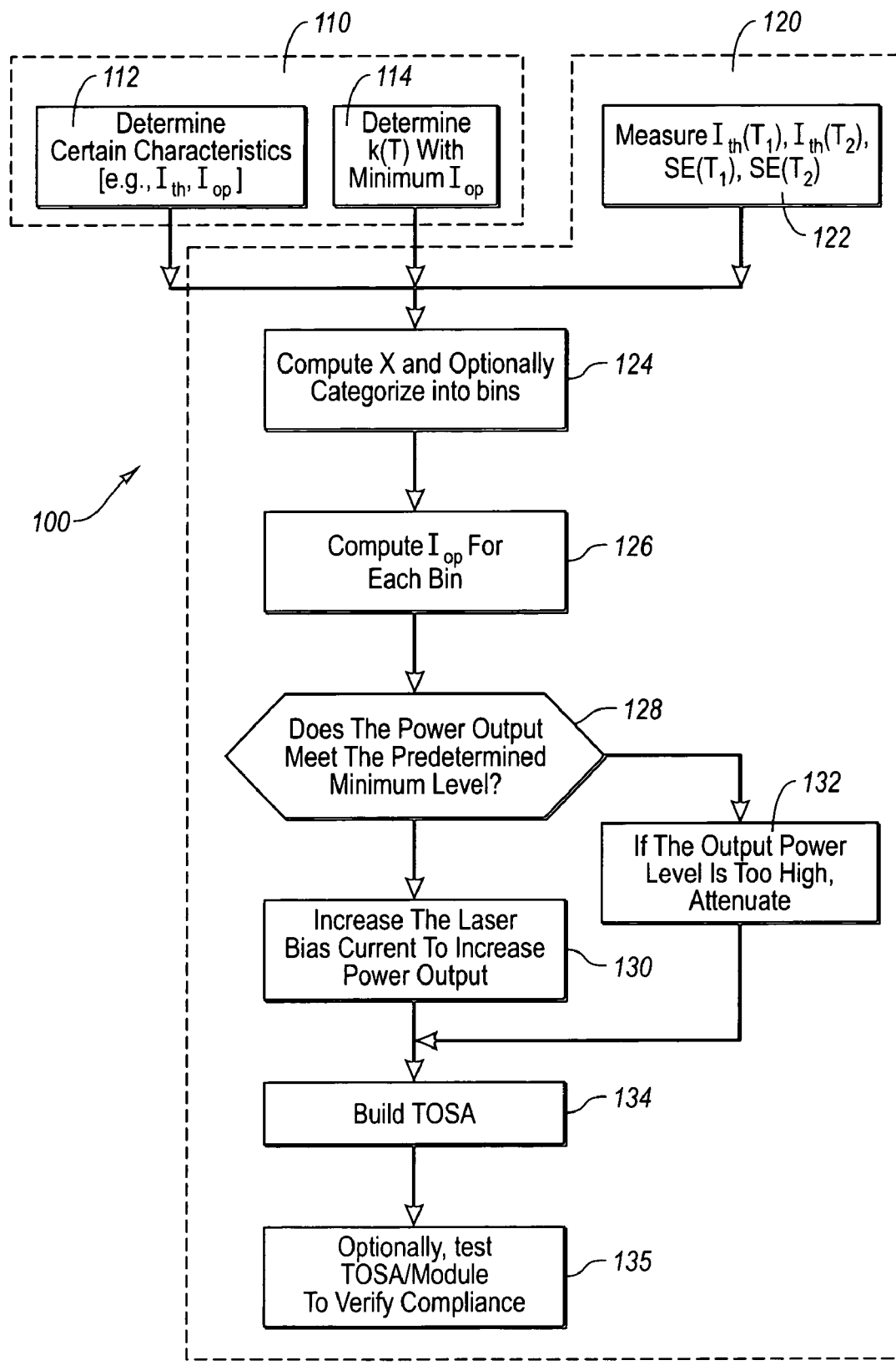
FIG. 2 is a flow chart illustrating the laser diode dc drive current optimization method in accordance with the invention.

FIG. 2 depicts an optimization method 100 whereby the dc driving current is optimized. The method 100 includes a group process 110 and an individual process 120. Values determined in the group process 110 are for a certain type of laser, and thus apply to a group of lasers. Values determined in the individual process 120 are for individual lasers of the relevant group of lasers.

Laser diodes of a particular type behave similarly over temperature. In stage 112, laser diodes are characterized into types/groups based on various factors including manufacturer, chip/packaging design, and general characteristics. General characteristics include threshold current ($I_{th}$) and slope efficiency (SE), both of which are usually functions of temperature. As an example of laser diode temperature dependence, for many types of laser diodes, increasing the temperature will cause the threshold current $I_{th}$ [mA] to increase and cause its slope efficiency SE [mW/mA] to decrease.

To determine $I_{th}$ as a function of temperature, it is first determined whether $I_{th}$ is an exponential (typical of longwave lasers) or a parabolic (typical of some 850 nm VCSELs) function of temperature. The functional dependence equation describing the variation of performance parameters (e.g., $I_{th}$ and SE) may be provided by the manufacturer or obtained from other sources. Alternatively, the relationship may be experimentally determined for a given laser diode type by statistical sampling measurements at different temperatures. For longwave lasers, the functional dependence of threshold current Ith on temperature is as follows:

$$I_{th}(T)=Ith_{T1}\exp[(T-T_1)/T_0] \quad \text{(equation 1)}$$

wherein $T_1$=lowest expected operating temperature (usually room temperature during TOSA assembly process), $T_0$ is a characteristic temperature, and T=a temperature of interest.

In addition to $I_{th}$ and SE, a characteristic minimum bias current for a particular laser type that will guarantee a sufficient operation speed is determined. The dc bias current that results in sufficient operating speed is determined at different temperatures within the target temperature range to determine the minimum dc bias current. Using this minimum dc bias current, the characteristic minimum bias current may be determined in terms of k, which is calculated as follows:

$$k(T)=(I_{op}-I_{th})/I_{th} \quad \text{(equation 2)}$$

The performance of modules in terms of eye diagram mask margin at the required data rate can be studied for various bias levels and k, which is the bias current offset above threshold current normalized by the threshold current. Although the exact value of $I_{th}$ varies among different diodes in a group, the value of k is substantially constant for all diodes in the group.

In stage 114, values of k are measured at $T_1$ and $T_2$ to determine $k_{T1}$ and $k_{T2}$. $k_{T1}$ and $k_{T2}$ are k values corresponding to the minimum bias current requirements at $T_1$ and $T_2$, respectively. The temperature range from $T_1$ to $T_2$ is herein referred to as the "target temperature range." For example, $T_1$ may be the room temperature during TOSA assembly process, and $T_2$ may be the highest expected operating temperature, although the invention is not so limited. The laser speed is proportional to k. Thus, for each laser diode type, values $k_{T1}$ and $k_{T2}$ that will consistently give good speed performance at a particular temperature and data rate are determined.

In stage 122, individual laser diodes are characterized to determine certain constants in the functional dependence equation (e.g., equation 1). Once the functional dependence of a parameter on temperature is known (stage 112), a minimal amount of data is required to fully characterize additional laser parts of the same type. Typically, data at two temperatures are needed to accurately extrapolate/interpolate to arbitrary temperatures near or between the measured data points. As mentioned above, the first of two temperatures ($T_1$) may be the room temperature during TOSA assembly process, and the second temperature ($T_2$) may be the highest expected operating temperature. A person of ordinary skill in the art will understand that $T_2$ may be set higher than the actual highest operating temperature to include a safety margin. Also, $T_2$ may be higher than the highest expected module operating temperature because the TOSA may run hotter than the module specification temperature.

A person of ordinary skill in the art will understand that not every single laser diode in the relevant group of diodes needs to be tested, as long as enough laser diodes are tested to provide the desired level of statistical confidence. For each individual laser diode, $Ith_{T1}$, $Ith_{T2}$, $SE_{T1}$, and $SE_{T2}$ are determined, either by measurement or based on the data provided by the manufacturer(s).

Based on the data on individual parts and the known functional form of their temperature dependence, $I_{th}$ and SE may be calculated at any desired temperature T. Combining the data points ($T_1$, $Ith_{T1}$) and ($T_2$, $Ith_{T2}$) with equation 1 provided above, the characteristic temperature $T_0$ may be calculated as:

$$T_o = \frac{T_2 - T_1}{\ln\left(\frac{Ith_{T2}}{Ith_{T1}}\right)}.$$

The characteristic temperature $T_0$ varies even between different lasers from the same wafer. The measurements may include building a statistical sample of lasers into TOSAs and testing those TOSAs in transceiver modules. Since $Ith_{T1}$ and $T_0$ are known, $I_{th}$ can be determined at any given temperature using equation 1.

Similarly, the SE may be measured at $T_1$ and $T_2$ to obtain $SE_{T1}$ and $SE_{T2}$ and scaled with the formula $$\frac{dSE}{dT} = \frac{10\log10\left(\frac{SE_{T2}}{SE_{T1}}\right)}{T_2 - T_1}$$

in units of dB/degree.

Then, SE can be calculated as:

$$SE(T) = SE_{T_1} \cdot 10^{\left(\frac{dSE}{dT} \cdot (T-T_1)/10\right)}. \qquad \text{(equation 3)}$$

It is useful to define a dimensionless parameter $X(T_1, T_2)$ that can be used to characterize a laser diode's behavior between temperatures $T_1$ and $T_2$. In stage 124, a dimensionless value $X(T_1, T_2)$ is computed as follows:

$$X(T_1, T_2) \equiv \frac{k_{T2}}{k_{T1}} \frac{Ith_{T2}}{Ith_{T1}} \frac{SE_{T2}}{SE_{T1}}. \qquad \text{(equation 4)}$$

Optionally, laser diodes can be categorized into different bins based on the value of X, such that the laser diodes in each bin performs similarly over the target temperature range. This type of categorization minimizes manufacturing traceability requirements. Whereas $k_{T1}$ and $k_{T2}$ are known for a group of laser diodes, X is calculated for each individual laser diode.

Usually, X>1 for longwave lasers. Thus, if the laser bias is chosen to satisfy the minimum value of k for the speed requirement at the highest operating temperature, it will also satisfy the minimum value of k (speed) at lower temperatures. X is forced to be at least 1 so that it will correctly handle the usual case as well as the anomalous case in which the laser requires a higher bias at room temperature than at its highest operating temperature. The dc operating current for a particular laser diode can now be calculated at any temperature based on the individual laser data at $T_1$ and $T_2$.

The interplay between drive current and laser diode parameters depends on the details of a particular module circuit design. For example, if a constant optical power feedback loop is used, as is commonly the case, the laser optical power will remain constant even though the laser Ith and SE change over temperature. The relationship between dc bias currents that will be used at different temperatures can be calculated given the constraint of constant output power. Based on the condition of constant output power, the bias current needed at temperature $T_1$ that will give optimal bias current at temperature $T_2$ is determined. $P = k_{T_2} \cdot Ith_{T_2} \cdot SE_{T_2} = k' \cdot Ith_{T_1} \cdot SE_{T_1}$, where P is the laser optical power (also referred to as $P_{laser}$), and $k' = (I_{op} - Ith_{T_1})/Ith_{T_1}$ gives the operating current bias above threshold at temperature $T_1$ that will result from constant power feedback. Note that k' is distinct from $k_{T_1}$, which is the minimum value required for the operating speed. The operating current required at $T_1$ to satisfy speed requirements at $T_2$ is given by $$I_{op} = (1 + k') Ith_{T1}.$$

When these parameters are used in building up TOSAs, $k_{T_1}$ is known for a particular laser type and $X(T_1, T_2)$ must be calculated for each laser from test data for $I_{th}$ and SE at temperatures $T_1$ and $T_2$. Rewriting k' in terms of $k_{T2}$, in stage 126, the operating current is determined by using the dimensionless value $X(T_1, T_2)$:

$$I_{op}(T_1) = (1 + X(T_1, T_2) k_{T_1}) Ith_{T_1} \qquad \text{(equation 5)}.$$

The operating current calculated by equation 5 satisfies the minimum value of k determined in stage 114.

In stage 128, the $I_{op}(T_1)$ that is determined in stage 126 is tested to see if it satisfies the predetermined minimum TOSA optical power level. As $I_{op}$ increases, so does the optical power level. Thus, $I_{op}$ may be increased by adjusting a laser driver to produce an optical power level that is within the range required by the TOSA. If the optical power associated with this bias current is too low, the bias current may be increased, subject to laser lifetime and reliability constraints. This way, the required bias current for a given laser type to perform at a particular bit rate is determined at temperatures $T_1$ and $T_2$. The laser power may be measured or, alternatively, computed as $P_{laser} = (I_{op} - Ith) SE$. Similarly, the fiber coupled power can be measured or estimated as $P_{fiber} = CE \cdot P_{laser}$, where CE denotes the nominal coupling efficiency that is typically achieved between the TOSA and an optical fiber. Combining the two power equations, the power level is determined as $$P_{fiber} = CE(I_{op} - Ith)SE \quad \text{(equation 6)}.$$

If the bias current level ($I_{op}(T_1)$) does not meet the required power level as calculated by equation 6, either the laser diode driver is tuned to increase the current or the output is attenuated (described below).

Given a particular circuit design such as constant power feedback, the laser driver requirements can be computed for all temperatures of interest. In particular, the worst case values can be compared with the physical limits of the circuit, which may be known from design or determined by a statistical sampling of measurements of the circuits.

Once the laser operating bias current is determined at a particular temperature, the laser ac and dc drive requirements for the laser driver circuit may be computed. Given a particular dc bias, the ac swing that is required to hit a particular extinction ratio target may be calculated. In stage 128, the $I_{op}$ determined in stage 126 is further tested to see whether the calculated $I_{op}$ levels can be supported by the type of laser driver that is contemplated. The maximum dc and ac laser driver current requirements are calculated as:

$$\text{maximum } I_{dc} = I_{op}, \text{ and}$$

$$\text{maximum } I_{ac} = k \cdot Ith \cdot \frac{(10^{(ER/10)} - 1)}{(10^{(ER/10)} + 1)},$$

wherein $ER$ = extinction ratio.

This test enhances cost efficiency, as a laser diode that fails the test (i.e., exceeds the maximum laser driver limit) can be rejected without the burdensome procedure of being built into the TOSA for testing.

In stage 134, the laser diode(s) that passed the test in stage 130 is built into the TOSA. If the optical power of the TOSA output exceeds the target power specification window when operating at the bias current $I_{op}$ calculated in stage 126, the power level may be reduced by optical attenuation (stage 132). Optical attenuation may be achieved by any of the conventional methods a person of ordinary skill in the art deems suitable, including but not limited to using a neutral density filter, suing a rotated linear polarizer, and adjusting the distance between the laser, lens, and fiber to control the amount of fiber-coupled light. The latter procedure may be implemented by mounting a lens in a fixed position within the TOSA, and positioning (e.g., press-fitting, gluing) the laser diode to the appropriate depth as determined by monitoring the focal position on a camera or by continually checking the fiber-coupled light directly. Optimizing the current to meet a minimum power level and attenuating the output signal if the signal power level is too high is preferable to the alternative of setting the bias current to achieve a particular power, because the latter method does not guarantee laser frequency response.

Optionally, after performing the optimization method 100, a TOSA is built (stage 134) using the values determined above. The TOSA is then built into a module and optionally tested so that the laser speed compliance is verified in the exact system of interest (stage 135). Performance of this optional testing is preferred because it ensures accuracy. Alternatively, laser speed may be characterized at the laser or TOSA level. Characterization at the laser or TOSA level may be done by determining the relaxation oscillation frequency as a function of bias current in terms of k for various temperatures, for example by sweeping the frequency of an ac current modulation and monitoring the optical power modulation on a high speed photodiode.

While the foregoing has been with reference to a particular embodiment of the invention, it will be appreciated by those skilled in the art that changes in this embodiment may be made without departing from the principles and spirit of the invention.

What is claimed is:

1. A method for determining a laser diode dc bias current for operation at a required speed over a target temperature range, the method comprising:
   determining a functional dependence of performance parameters on temperature for a group of laser diodes, at least one of the performance parameters including threshold current ($I_{th}$);
   determining a parameterized fractional increase above $I_{th}$ that results in a required operating speed for the group, where a minimum bias current ($I_{op}$) is based on the required operating speed;
   determining a minimum k value for select laser diodes in the group using the minimum bias current ($I_{op}$), wherein a k value is defined as a bias current offset above a threshold current normalized by the threshold current (($I_{op} - I_{th}$)/$I_{th}$); and
   selecting a bias current for an individual laser diode in the group based on the minimum k value, the selected bias current corresponding to a predetermined optical power level.

2. The method of claim 1 further comprising determining the output power level of the individual laser diode based on a slope efficiency of the laser diode and a fiber coupling efficiency.

3. The method of claim 1, wherein selecting the bias current is further based on $X(T_1, T_2)$, wherein $$X(T_1, T_2) \equiv \frac{k_{T_2} Ith_{T_2} SE_{T_2}}{k_{T_1} Ith_{T_1} SE_{T_1}},$$

where $k_{T_1}$ is a k value corresponding to a minimum bias current required at a first temperature ($T_1$) for the group, wherein $k_{T_1} \geq$ the minimum k value determined for select laser diodes in the group,
$k_{T_2}$ is a k value corresponding to a minimum bias current required at a second temperature ($T_2$) for the group,
$Ith_{T_1}$ is a threshold current at $T_1$ for the individual laser diode in the group,
$Ith_{T_2}$ is a threshold current at $T_2$ for the individual laser diode,
$SE_{T_1}$ is a slope efficiency at $T_1$ for the individual laser diode, and
$SE_{T_2}$ is a slope efficiency at $T_2$ for the individual laser diode.

4. The method of claim 3, wherein selecting the bias current is further based on calculating a bias current required at $T_1$ to satisfy operating speed requirements at $T_2$, calculated as:

$$(1 + X(T_1, T_2) k_{T_1}) Ith_{T_1}.$$

5. The method of claim 1 further comprising:
   determining threshold currents ($Ith_{T_1}, Ith_{T_2}$), slope efficiencies ($SE_{T_1}, SE_{T_2}$) and k values ($k_{T_1}, k_{T_2}$) at multiple temperatures $T_1$ and $T_2$ for select laser diodes in the group;
   calculating $X(T_1, T_2)$ for each of the selected laser diodes, wherein $$X(T_1, T_2) \equiv \frac{k_{T_2} Ith_{T_2} SE_{T_2}}{k_{T_1} Ith_{T_1} SE_{T_1}}$$

wherein $k_{T1}$ and $k_{T2}$ are determined for the group of laser diodes and $Ith_{T1}$, $Ith_{T2}$, $SE_{T1}$, and $SE_{T2}$ are determined for individual laser diodes in the group; and categorizing the laser diodes according to values of X.

6. The method of claim 5 wherein $T_1$ is room temperature and $T_2$ is approximately a highest expected operating temperature.

7. The method of claim 5 wherein $T_1$ is room temperature and $T_2$ is a temperature at which the laser diodes typically require a highest optical output power while satisfying minimum bias current conditions needed for laser response.

8. The method of claim 1 wherein determining the functional dependence comprises taking measurements at different temperatures within a target temperature range.

9. The method of claim 1 farther comprising optically attenuating an output from the individual laser diode to achieve the predetermined power level.

10. The method of claim 1 farther comprising setting the individual laser diode's output power to a maximum required value over the target temperature range.

11. The method of claim 1 further comprising:
building one of the laser diodes into a transmitter optical subassembly (TOSA); and
testing the TOSA to verify compliance with the required speed over the target temperature range.

12. The method of claim 1 further comprising:
building one of the laser diodes into a module; and
testing the module to verify compliance with the required speed over the target temperature range.

13. The method of claim 1 further comprising predicting ac and dc drive current requirements for a minimal frequency response at various temperatures(T), wherein the ac drive current ($I_{ac}$) and dc drive current ($I_{dc}$) are computed as:

$$I_{ac}(T) = k(T) \cdot Ith \cdot \frac{(10^{(ER/10)} - 1)}{(10^{(ER/10)} + 1)},$$

where k(T) is a k value corresponding to a minimum bias current required at a temperature T and ER is a required extinction ratio between 1 and 0 bit power levels in dB, and $$I_{dc}(T) = (1+k(T))Ith(T).$$

14. The method of claim 13 further comprising determining whether the ac and dc drive currents are supported by a particular laser driver at the predetermined power level.

15. A method of determining a dc bias current for a laser diode, the method comprising:

grouping laser diodes into bins of similar performance over temperature (T) based on a dimensionless parameter $$X(T_1, T_2) \equiv \frac{k_{T2} Ith_{T2} SE_{T2}}{k_{T1} Ith_{T1} SE_{T1}},$$

wherein $k_{T1} = (I_{op} - I_{th}(T_1))/I_{th}(T_1)$ for the group, $k_{T2} = (I_{op} - I_{th}(T_2))/I_{th}(T_2)$ for the group, $I_{op}$=minimum dc bias current that provides target operating speed, $Ith_{T1}$=threshold current at $T_1$ for an individual laser diode in the group, $Ith_{T2}$=threshold current at $T_2$ for the individual laser diode, $SE_{T1}$=slope efficiency at $T_1$ for the individual laser diode, $SE_{T2}$=slope efficiency at $T_2$ for the individual laser diode, and T1 and T2 are first and second temperatures, respectively; and determining a dc bias current $I_{op}(T_1) = (1+X(T_1, T_2)k_{T1}) Ith_{T1}$ for the laser diodes in the bin.

16. The method of claim 15 further comprising mounting one of the laser diodes in a transmitter optical subassembly (TOSA) that is used in an electronics package transmitter or transceiver module.

* * * * *

UNITED STATES PATENT AND TRADEMARK OFFICE
CERTIFICATE OF CORRECTION

| | |
|---|---|
| PATENT NO. | : 7,515,620 B2 |
| APPLICATION NO. | : 10/426472 |
| DATED | : April 7, 2009 |
| INVENTOR(S) | : Gustavson et al. |

It is certified that error appears in the above-identified patent and that said Letters Patent is hereby corrected as shown below:

Column 1
Line 61, change "de" to --dc--

Column 3
Line 48, change "is" to --are--

Column 4
Line 53, after "above" insert --the--

Column 6
Line 9, change "performs" to --perform--

Column 8
Line 43, change "$\geqq$" to --$\geq$--

Column 9
Line 38, change "temperatures(T)" to --temperatures (T)--

Column 10
Line 35, change "T1 and T2" to --$T_1$ and $T_2$--

Signed and Sealed this
Fifteenth Day of March, 2011

David J. Kappos
*Director of the United States Patent and Trademark Office*